US012593171B2

(12) United States Patent
Xia et al.

(10) Patent No.: US 12,593,171 B2
(45) Date of Patent: Mar. 31, 2026

(54) CIRCUIT FOR USING SPEAKER CABLE FOR RADIO FREQUENCY SIGNAL TRANSMISSION

(71) Applicant: Beken Corporation, Shanghai (CN)

(72) Inventors: Siqing Xia, Shanghai (CN); Ruimin Wang, Shanghai (CN); Qunshan Xu, Shanghai (CN); Shuguang Zhang, Shanghai (CN)

(73) Assignee: Beken Corporation, Shanghai (CN)

( * ) Notice: Subject to any disclaimer, the term of this patent is extended or adjusted under 35 U.S.C. 154(b) by 408 days.

(21) Appl. No.: 18/507,897

(22) Filed: Nov. 13, 2023

(65) Prior Publication Data

US 2025/0106553 A1     Mar. 27, 2025

(30) Foreign Application Priority Data

Sep. 27, 2023     (CN) .......................... 202311269318.5

(51) Int. Cl.
*H04R 3/00*          (2006.01)
*H03F 1/56*          (2006.01)
*H03F 3/20*          (2006.01)
(52) U.S. Cl.
CPC ................. *H04R 3/00* (2013.01); *H03F 1/56* (2013.01); *H03F 3/20* (2013.01); *H03F 2200/03* (2013.01); *H03F 2200/423* (2013.01); *H03F 2200/451* (2013.01)

(58) Field of Classification Search
CPC ..... H04R 3/00; H03F 1/56; H03F 3/20; H03F 2200/03; H03F 2200/423; H03F 2200/451; H03F 3/2173; H03F 3/183
USPC ......................................................... 381/120
See application file for complete search history.

(56) References Cited

U.S. PATENT DOCUMENTS

| | | | | |
|---|---|---|---|---|
| 2012/0252382 A1* | 10/2012 | Bashir | .................... | H04B 17/13 |
| | | | | 455/114.3 |
| 2014/0073271 A1* | 3/2014 | Ilkov | ....................... | H03F 3/195 |
| | | | | 455/91 |

* cited by examiner

*Primary Examiner* — Carolyn R Edwards
*Assistant Examiner* — Friedrich Fahnert
(74) *Attorney, Agent, or Firm* — Schwegman Lundberg & Woessner, P.A.

(57) ABSTRACT

Various embodiments described herein support or provide for using speaker cables for radio frequency signal transmission, including generating, via an audio hardware component included in a circuit, a differential audio signal; generating, via a radio frequency hardware component included in the circuit, a radio frequency signal; and outputting the differential audio signal and the radio frequency signal via a speaker cable communicatively coupled to the circuit, the speaker cable being configured to operate as a Planar Inverted F-Antenna (PIFA).

20 Claims, 4 Drawing Sheets

200

GENERATE AN AUDIO SIGNAL    202

GENERATE A RADIO FREQUENCY SIGNAL    204

OUTPUT THE AUDIO SIGNAL AND THE RADIO FREQUENCY SIGNAL VIA A SPEAKER CABLE CONFIGURED TO OPERATE AS A PLANAR INVERTED F-ANTENNA (PIFA)    206

CIRCUIT FOR USING SPEAKER CABLE FOR RADIO FREQUENCY SIGNAL TRANSMISSION

CROSS REFERENCE TO RELATED APPLICATION

This application claims priority to and incorporates by reference Chinese patent application no. 202311269318.5 filed 27 Sep. 2023.

TECHNICAL FIELD

The present disclosure generally relates to circuits, systems, and methods for using speaker cables for radio frequency signal transmission.

BACKGROUND

There are challenges when it comes to using speaker cables (or audio cables) for radio frequency signal transmission. Speaker cables are generally not designed to handle the high frequencies and low impedance levels associated with radio frequency signals. Using an audio cable for RF signal transmission may result in low antenna efficiency, which indirectly causes insufficient isolation between audio signals and RF signals. Improvements are needed.

SUMMARY

An embodiment provides a circuit comprising an audio hardware component configured to output a differential audio signal; a radio frequency hardware component configured to output a radio frequency signal; an audio power amplifier output matching network communicatively coupled to the audio hardware component and a first capacitor, a positive audio signal output pad, and a first inductor that is communicatively coupled to a negative signal output pad and a second capacitor; a radio frequency matching network communicatively coupled to the radio frequency hardware component and a third capacitor that is communicatively coupled to the audio power amplifier output matching network, the first capacitor, and the first inductor; and a speaker communicatively coupled to a speaker cable that comprises plural wires communicatively coupled to the positive audio signal output pad and the negative signal output pad.

In an embodiment of the circuit, the audio power amplifier output matching network comprises a fourth capacitor, a fifth capacitor, a first resistor, a second resistor, a second inductor, and a third inductor, the fourth capacitor communicatively coupled to the first resistor and the second inductor, the fifth capacitor communicatively coupled to the second resistor and the third inductor.

In an embodiment of the circuit, the first resistor and the second resistor are communicatively coupled to ground.

In an embodiment of the circuit, a frequency range of the radio frequency signal is between 2.4 GHz and 2.5 GHZ, and the audio power amplifier output matching network comprises a hardware component that matches impedance of the audio hardware component to impedance of the speaker, and the radio frequency matching network comprises a hardware component that matches impedance of the radio frequency hardware component to the impedance of the speaker.

In an embodiment of the circuit, the positive audio signal output pad is communicatively coupled to a positive wire included in the speaker cable, and the negative signal output pad is communicatively coupled to a negative wire included in the speaker cable.

In an embodiment of the circuit, the speaker cable functions as an antenna for radio frequency signal transmission during operation.

In an embodiment of the circuit, energy of the radio frequency signal passes through the first capacitor with little or no energy passing through the first inductor, causing the speaker cable to operate as an antenna for radio frequency signal transmission.

In an embodiment of the circuit, the antenna for radio frequency signal transmission is a Planar Inverted F-Antenna (PIFA).

In an embodiment of the circuit, the first inductor is communicatively coupled to the negative signal output pad and directly to ground without including the second capacitor.

In an embodiment of the circuit, the speaker cable functions as a monopole antenna for radio frequency signal transmission during operation.

An embodiment provides a method comprising generating, via an audio hardware component included in a circuit, a differential audio signal; generating, via a radio frequency hardware component included in the circuit, a radio frequency signal; and outputting the differential audio signal and the radio frequency signal via a speaker cable communicatively coupled to the circuit, the speaker cable being configured to operate as a Planar Inverted F-Antenna (PIFA).

In an embodiment of the method, the circuit comprises an audio power amplifier output matching network, a radio frequency matching network, the audio power amplifier output matching network being communicatively coupled to the audio hardware component and a first capacitor, a positive audio signal output pad, and a first inductor that is communicatively coupled to a negative signal output pad and a second capacitor, the radio frequency matching network being communicatively coupled to the radio frequency hardware component and a third capacitor that is communicatively coupled to the audio power amplifier output matching network, the first capacitor, and the first inductor.

In an embodiment of the method, the audio power amplifier output matching network comprises a fourth capacitor, a fifth capacitor, a first resistor, a second resistor, a second inductor and a third inductor, the fourth capacitor communicatively coupled to the first resistor and the second inductor, the fifth capacitor communicatively coupled to the second resistor and the third inductor.

In an embodiment of the method, the first resistor and the second resistor are communicatively coupled to ground.

In an embodiment of the method, the positive audio signal output pad is communicatively coupled to a positive wire included in the speaker cable, and the negative signal output pad is communicatively coupled to a negative wire included in the speaker cable.

In an embodiment of the method, energy of the radio frequency signal passes through the first capacitor with little or no energy passing through the first inductor, causing the speaker cable to operate as an antenna for radio frequency signal transmission.

In an embodiment of the method, the first inductor is communicatively coupled to the negative signal output pad and directly to ground without the second capacitor.

In an embodiment of the method, the speaker cable functions as a monopole antenna for radio frequency signal transmission during operation.

In an embodiment of the method, a frequency range of the radio frequency signal is between 2.4 GHz and 2.5 GHz.

An embodiment provides a system comprising, an audio hardware component configured to output a differential audio signal; a radio frequency hardware component configured to output a radio frequency signal; an audio power amplifier output matching network communicatively coupled to the audio hardware component and a first capacitor, a positive audio signal output pad, and a first inductor that is communicatively coupled to a negative signal output pad and a second capacitor; a radio frequency matching network communicatively coupled to the radio frequency hardware component and a third capacitor that is communicatively coupled to the audio power amplifier output matching network, the first capacitor, and the first inductor; and a speaker communicatively coupled to a speaker cable that comprises plural wires communicatively coupled to the positive audio signal output pad and the negative signal output pad, the speaker cable is configured to operate as a Planar Inverted F-Antenna (PIFA) or a monopole antenna for radio frequency signal transmission.

BRIEF DESCRIPTION OF THE DRAWINGS

In the drawings, which are not necessarily drawn to scale, like numerals may describe similar components in different views. To easily identify the discussion of any particular element or act, the most significant digit or digits in a reference number refer to the figure number in which that element is first introduced. Some embodiments are illustrated by way of examples, and not limitations, in the accompanying figures.

DETAILED DESCRIPTION

Figure 1:
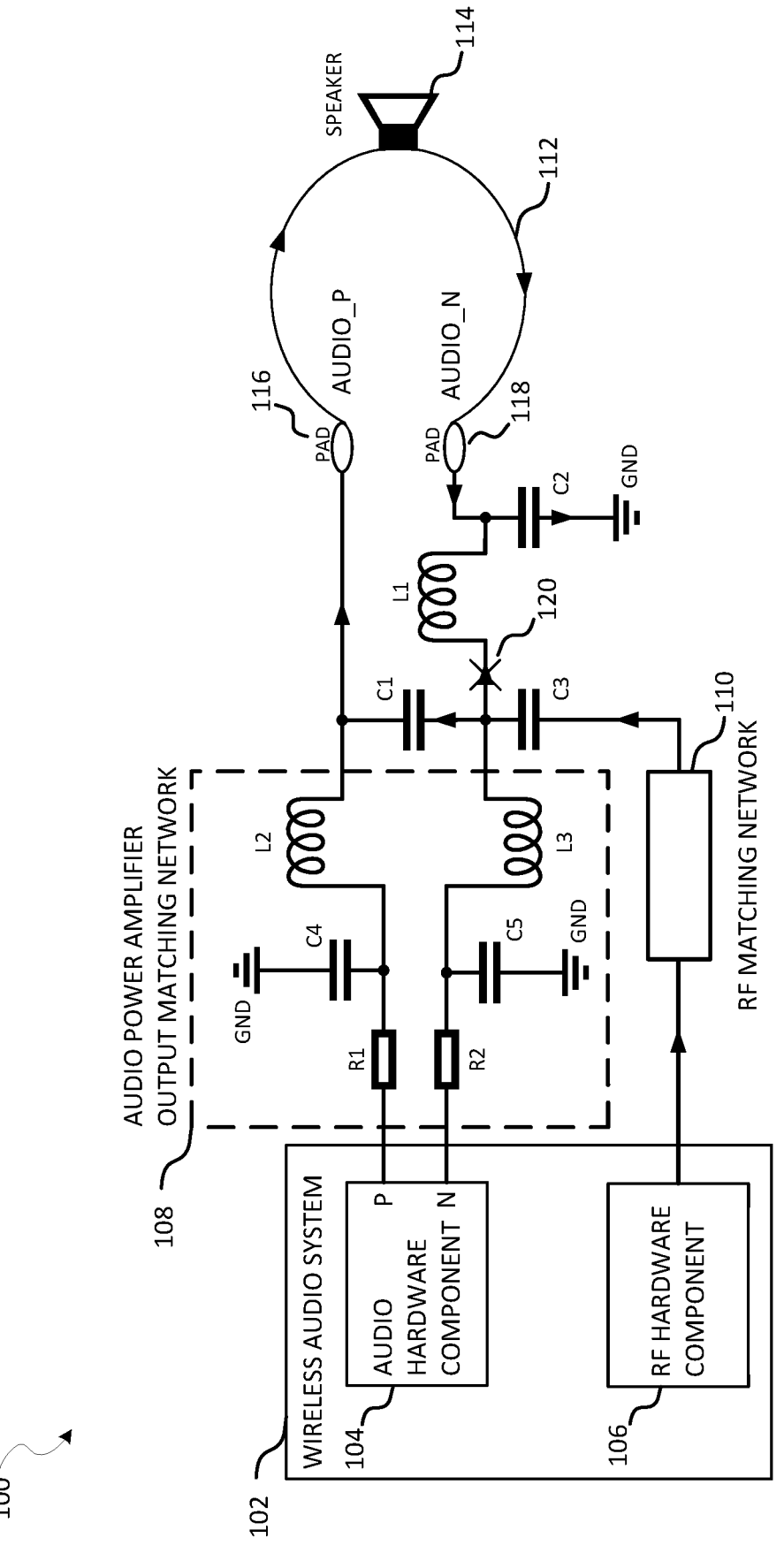
FIG. 1 is a block diagram showing an example circuit configured for using speaker cables for radio frequency signal transmission, according to various embodiments.

The description that follows includes systems, methods, techniques, instruction sequences, and computing machine program products that embody illustrative embodiments of the present disclosure. In the following description, for purposes of explanation, numerous specific details are set forth in order to provide a thorough understanding of embodiments. It will be evident, however, to one skilled in the art that the present inventive subject matter can be practiced without these specific details.

Reference in the specification to "one embodiment" or "an embodiment" means that a particular feature, structure, or characteristic described in connection with the embodiment is included in at least one embodiment of the present subject matter. Thus, the appearances of the phrase "in one embodiment" or "in an embodiment" appearing in various places throughout the specification are not necessarily all referring to the same embodiment.

For purposes of explanation, specific configurations, and details are set forth in order to provide a thorough understanding of the present subject matter. However, it will be apparent to one of ordinary skill in the art that embodiments of the subject matter described can be practiced without the specific details presented herein, or in various combinations, as described herein. Furthermore, well-known features can be omitted or simplified in order not to obscure the described embodiments. Various embodiments may be given throughout this description. These are merely descriptions of specific embodiments. The scope or meaning of the claims is not limited to the embodiments given.

To reduce production costs, systems and/or circuits can be designed to use speaker cables (also referred to as audio cables) as antennas for radio frequency (RF) signal transmission. However, audio cables are generally not designed to handle high frequencies and low impedance levels associated with radio frequency signals. Depending on the application, RF signals can range from a few kilohertz (KHz) to many gigahertz (GHz). Cables that handle RF signals are designed with specific impedance values and shielding to minimize signal loss and interference, and to maintain the integrity of the signal over long distances. Further, factors, such as the lay length and the overall length of an audio cable, can affect the quality of radio frequency signal transmission. There are not many options to improve the RF signal transmission quality except for changing the overall length of the speaker cable. Improvements are needed.

Various embodiments include circuits, methods, and systems for using speaker cables for radio frequency signal transmission. Specifically, a circuit includes an audio hardware component, a radio frequency hardware component, an audio power amplifier output matching network, a radio frequency matching network, a speaker cable that is communicatively coupled to a speaker. A speaker can refer to any type of audio speaker that is designed with different characteristics in terms of size, shape, and sound quality. The audio hardware component is configured to output audio signals (e.g., differential audio signals). The radio frequency hardware component is configured to output radio frequency signals. The audio power amplifier output matching network is communicatively coupled to the audio hardware component and a first capacitor, a positive audio signal output pad, and a first inductor communicatively coupled to a negative signal output pad and a second capacitor.

In various embodiments, a matching network can refer to a hardware component that matches the impedance of a source to the impedance of a load. For example, an audio power amplifier output matching network refers to a hardware component that matches the impedance of the audio hardware component to the impedance of the speaker. A radio frequency matching network refers to a hardware component that matches the impedance of the radio frequency hardware component to the impedance of the speaker.

In various embodiments, the radio frequency matching network is communicatively coupled to the radio frequency hardware component and a third capacitor that is communicatively coupled to the audio power amplifier output matching network, the first capacitor, and the first inductor. The speaker is communicatively coupled to a speaker cable that comprises plural wires communicatively coupled to the positive audio signal output pad and the negative signal output pad. In various embodiments, the positive audio signal output pad is communicatively coupled to a positive wire included in the speaker cable. The negative signal output pad is communicatively coupled to a negative wire included in the speaker cable.

In various embodiments, the audio power amplifier output matching network comprises a fourth capacitor, a fifth capacitor, a first resistor, a second resistor, a second inductor, and a third inductor. The fourth capacitor is communicatively coupled to the first resistor and the second inductor. The fifth capacitor is communicatively coupled to the second resistor and the third inductor. The first resistor and the second resistor are communicatively coupled to the ground.

In various embodiments, the first capacitor, the first inductor, the third capacitor, and the second capacitor can be replaced by any number of radio frequency unidirectional transmission electrical components. Such a component operates to enable RF signal transmission in one direction while completely isolating or attenuating in the other direction, thereby controlling and protecting the RF signal. Various radio frequency unidirectional transmission electrical components include unidirectional couplers, unidirectional amplifiers, unidirectional filters, etc.

In various embodiments, the values of the first capacitor, the first inductor, the third capacitor, and the second capacitor can be adjusted so that the impedance of the antenna matches the output impedance of a receiver or transmitter. In various embodiments, the first capacitor, the first inductor, the third capacitor, and the second capacitor function as a tuning antenna matching network that optimizes the matching between the antenna and a receiver or transmitter. A tuning antenna matching network can adjust the impedance of the antenna to match the output impedance of the receiver or transmitter, in order to maximize the efficiency of RF signal transmission.

In various embodiments, the frequency range of a radio frequency signal is between 2.4 GHz and 2.5 GHz.

In various embodiments, the speaker cable functions as an antenna for radio frequency signal transmission during operation. The energy of the radio frequency signal can pass through the first capacitor with little or no energy passing through the first inductor, causing the speaker cable to operate as an antenna for radio frequency signal transmission, such as a Planar Inverted F-Antenna (PIFA).

In various embodiments, the first inductor is communicatively coupled to the negative signal output pad and directly to ground without including the second capacitor. The speaker cable functions as a monopole antenna for radio frequency signal transmission during operation.

The circuits described herein can be implemented in any of a variety of electronic devices. For example, circuits can be implemented in a device, including some or all of the features, components, and peripherals of machine 400 shown in FIG. 4.

Reference will now be made in detail to embodiments, embodiments of which are illustrated in the appended drawings. The present disclosure may, however, be embodied in many different forms and should not be construed as being limited to the embodiments set forth herein.

FIG. 1 is a block diagram showing an example circuit 100 configured for using speaker cables for radio frequency signal transmission, according to various embodiments. To avoid obscuring the inventive subject matter with unnecessary detail, various functional components (e.g., modules, mechanisms, devices, nodes, etc.) that are not germane to conveying an understanding of the inventive subject matter have been omitted from FIG. 1. However, a person of ordinary skill in the art will readily recognize that various additional functional components may be supported to facilitate additional functionality that is not specifically described herein. Circuit 100 may be implemented in any of a variety of electronic devices. For example, circuit 100 may be implemented in a device, including some or all of the features, components, and peripherals of machine 400 shown in FIG. 4.

As shown, circuit 100 includes a wireless audio system 102 that includes an audio hardware component 104 and a radio frequency hardware component 106. Circuit 100 further includes an audio power amplifier output matching network 108, a radio frequency matching network 110, and a speaker cable 112 that is communicatively coupled to a speaker 114.

The audio hardware component 104 is configured to output audio signals (e.g., differential audio signals). The radio frequency hardware component 106 is configured to output radio frequency signals. The audio power amplifier output matching network is communicatively coupled to the audio hardware component 104 and a first capacitor C1, a positive audio signal output pad 116, and a first inductor L1 communicatively coupled to a negative signal output pad 118, and a second capacitor C2. A pad (e.g., pad 116, pad 118) can be the exposed region of metal on a circuit board that a component lead is soldered to.

As shown, the radio frequency matching network 110 is communicatively coupled to the radio frequency hardware component 106 and a third capacitor C3. The third capacitor C3 is communicatively coupled to the audio power amplifier output matching network 108, the first capacitor C1, and the first inductor L1. The speaker 114 is communicatively coupled to a speaker cable 112 that comprises plural wires communicatively coupled to the positive audio signal output pad 116 and the negative signal output pad 118. In various embodiments, the positive audio signal output pad 116 is communicatively coupled to a positive wire included in the speaker cable. The negative signal output pad 118 is communicatively coupled to a negative wire included in the speaker cable. The positive wire and the negative wire included in the speaker cable can be twisted as twisted pair cables.

In various embodiments, the audio power amplifier output matching network 108 comprises a fourth capacitor C4, a fifth capacitor C5, a first resistor R1, a second resistor R2, a second inductor L2, and a third inductor L3. The fourth capacitor C4 is communicatively coupled to the first resistor R1 and the second inductor L2. The fifth capacitor C5 is communicatively coupled to the second resistor R2 and the third inductor L3. The first resistor R1 and the second resistor R2 are communicatively coupled to the ground GND.

In various embodiments, the first capacitor C1, the first inductor L1, the third capacitor C3, and the second capacitor C2 can be replaced by any number of radio frequency unidirectional transmission electrical components. Such a component operates to enable RF signal transmission in one direction while completely isolating or attenuating in the other direction, thereby controlling and protecting the RF signal.

As shown in FIG. 1, the arrows illustrate an example RF signal transmission path during an operation of the example circuit 100. Specifically, in various embodiments, after an RF signal is generated by the RF hardware component 106, the RF signal is transmitted through, in an example order, the RF matching network 110, the third capacitor C3, the first capacitor C1, PAD 116, PAD 118, the second capacitor C2, and the ground. Arrow (with a cross sign) 120 indicates that the RF signal does not travel through the first inductor L1 as the first inductor L1 operates as a barrier and lets little or no energy of the RF signal pass through. Under this approach, the speaker cable operates as a Planar Inverted F-Antenna (PIFA) antenna for radio frequency signal transmission.

In various embodiments, the values of the first capacitor C1, the first inductor L1, the third capacitor C3, and the second capacitor C2 can be adjusted so that the impedance of the antenna described herein matches the output impedance of a receiver or transmitter. In various embodiments, the first capacitor C1, the first inductor L1, the third capacitor C3, and the second capacitor C2 function as a tuning antenna matching network that optimizes the matching between the antenna and a receiver or transmitter. A tuning antenna matching network can adjust the impedance of the antenna to match the output impedance of the receiver or transmitter, in order to maximize the efficiency of RF signal transmission.

In various embodiments, the frequency range of a radio frequency signal is between 2.4 GHz and 2.5 GHz.

In various embodiments, the speaker cable 112 functions as an antenna for radio frequency signal transmission during operation. The energy of the radio frequency signal can pass through the first capacitor C1 with little or no energy passing through the first inductor L1, causing the speaker cable 112 to operate as an antenna for radio frequency signal transmission, such as a Planar Inverted F-Antenna (PIFA).

In various embodiments, the first inductor L1 is communicatively coupled to the negative signal output pad 118 and directly to the ground GND without including the second capacitor C2. Speaker cable 112 functions as a monopole antenna for radio frequency signal transmission during operation.

Figure 2:
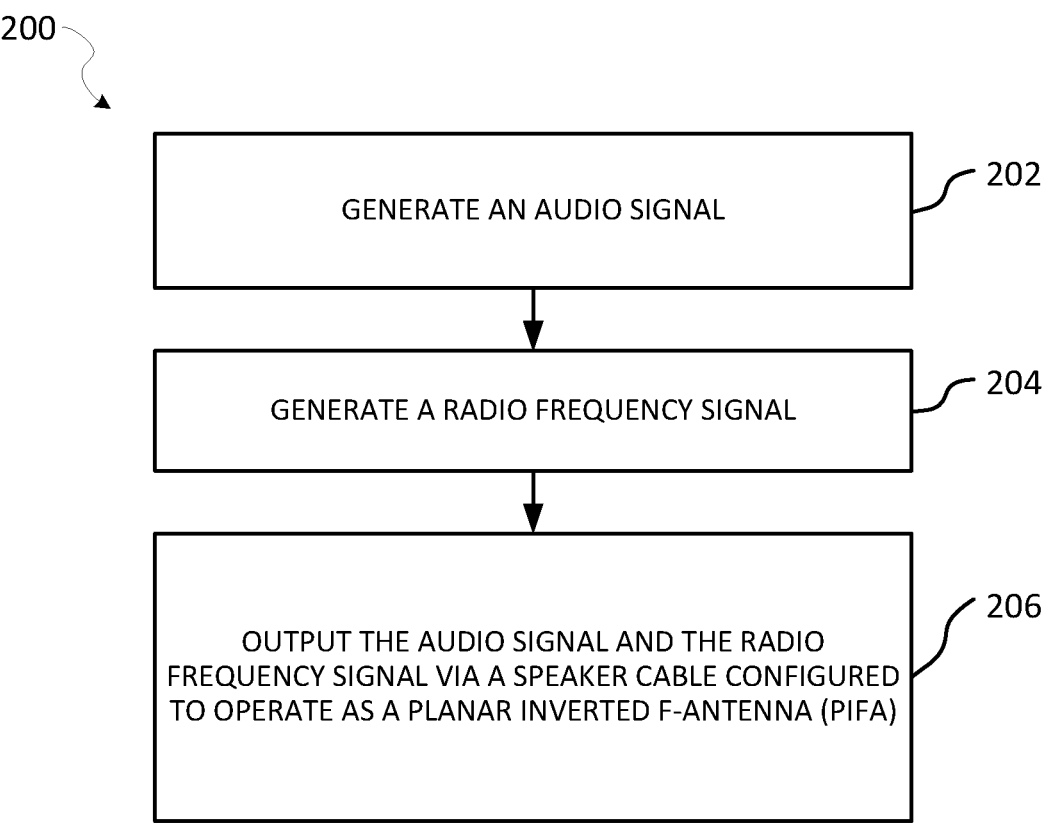
FIG. 2 is a flowchart illustrating an example method for using speaker cables for radio frequency signal transmission, according to various embodiments.

FIG. 2 is a flowchart illustrating an example method 200 for using speaker cables for radio frequency signal transmission, according to various embodiments. Depending on the example, an operation of an example method described herein may be repeated in different ways or involve intervening operations not shown. Though the operations of example methods may be depicted and described in a certain order, the order in which the operations are performed may vary among embodiments, including performing certain operations in parallel.

At operation 202, the circuit generates one or more audio signals (e.g., differential audio signals).

At operation 204, the circuit generates one or more radio frequency signals.

At operation 206, the circuit outputs the one or more differential audio signals and the one or more radio frequency signals via a speaker cable that is communicatively coupled to the circuit. The speaker cable is configured to operate as a Planar Inverted F-Antenna (PIFA) or a monopole antenna.

In various embodiments, though operations 204 and 206 are depicted and described in an order, the operations 204 and 206 can be performed concurrently or in parallel.

In various embodiments, the circuit includes an audio hardware component, a radio frequency hardware component, an audio power amplifier output matching network, a radio frequency matching network, a speaker cable that is communicatively coupled to a speaker. A speaker can refer to any type of audio speaker that is designed with different characteristics in terms of size, shape, and sound quality. The audio hardware component is configured to output audio signals (e.g., differential audio signals). The radio frequency hardware component is configured to output radio frequency signals. The audio power amplifier output matching network is communicatively coupled to the audio hardware component and a first capacitor, a positive audio signal output pad, and a first inductor communicatively coupled to a negative signal output pad and a second capacitor. The radio frequency matching network is communicatively coupled to the radio frequency hardware component and a third capacitor that is communicatively coupled to the audio power amplifier output matching network, the first capacitor, and the first inductor.

Figure 3:
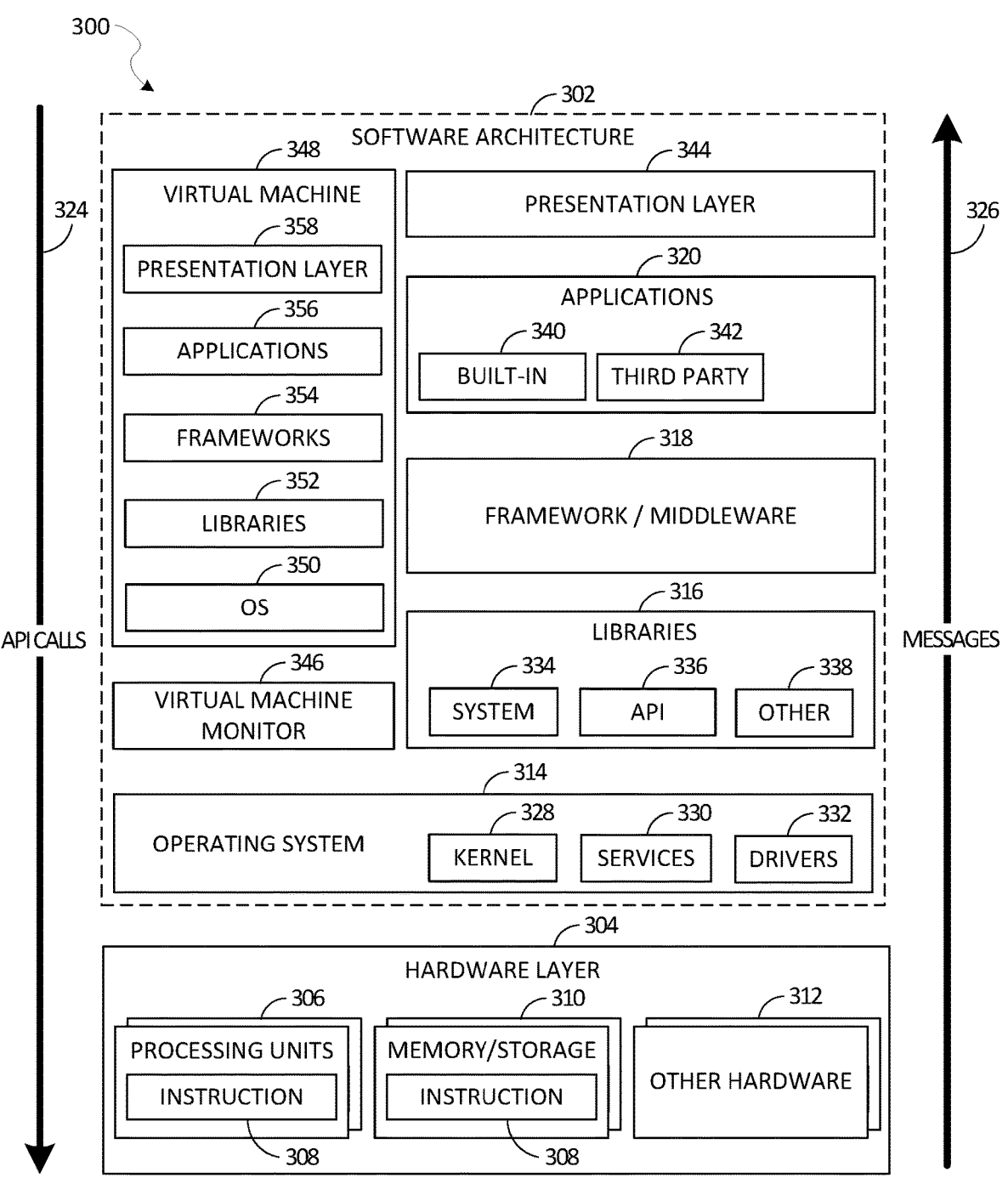
FIG. 3 is a block diagram illustrating a representative software architecture, which may be used in conjunction with various hardware architectures herein described, according to various embodiments.

FIG. 3 is a block diagram illustrating an example of a software architecture 300 that may be installed on a machine, according to some embodiments. FIG. 3 is merely a non-limiting example of a software architecture, and it will be appreciated that many other architectures may be implemented to facilitate the functionality described herein. The software architecture 302 may be executing on hardware such as a machine 400 of FIG. 4 that includes, among other things, processors 410, memory 430, and input/output (I/O) components 450. A representative hardware layer 304 is illustrated and can represent, for example, the machine 400 of FIG. 4. The representative hardware layer 304 comprises one or more processing units 306 having associated executable instructions 308. The executable instructions 308 represent the executable instructions of the software architecture 302. The hardware layer 304 also includes memory or storage modules 310, which also have the executable instructions 308. The hardware layer 304 may also comprise other hardware 312, which represents any other hardware of the hardware layer 304, such as the other hardware illustrated as part of the machine 400.

In the example architecture of FIG. 3, the software architecture 302 may be conceptualized as a stack of layers, where each layer provides particular functionality. For example, the software architecture 302 may include layers such as an operating system 314, libraries 316, frameworks/middleware 318, applications 320, and a presentation layer 344.

The operating system 314 may manage hardware resources and provide common services. The operating system 314 may include, for example, a kernel 328, services 330, and drivers 332. The kernel 328 may act as an abstraction layer between the hardware and the other software layers. The drivers 332 may be responsible for controlling or interfacing with the underlying hardware.

The libraries 316 may provide a common infrastructure that may be utilized by the applications 320 and/or other components and/or layers. The libraries 316 typically provide functionality that allows other software modules to perform tasks in an easier fashion than by interfacing directly with the underlying operating system 314 functionality (e.g., kernel 328, services 330, or drivers 332). The libraries 316 may include system libraries 334 (e.g., C standard library) that may provide functions such as memory allocation functions, string manipulation functions, mathematic functions, and the like.

The frameworks 318 (also sometimes referred to as middleware) may provide a higher-level common infrastructure that may be utilized by the applications 320 or other software components/modules. For example, the frameworks 318 may provide various graphical user interface functions, high-level resource management, high-level location services, and so forth.

The applications 320 include built-in applications 340 and/or third-party applications 342. The third-party applications 342 may include any of the built-in applications 340, as well as a broad assortment of other applications.

The applications 320 may utilize built-in operating system functions (e.g., kernel 328, services 330, or drivers 332), libraries (e.g., system libraries 334, API libraries 336, and other libraries 338), or frameworks/middleware 318 to create user interfaces to interact with users of the system.

Some software architectures utilize virtual machines. In the example of FIG. 3, this is illustrated by a virtual machine 348. The virtual machine 348 creates a software environment where applications/modules can execute as if they were executing on a hardware machine (e.g., the machine 400 of FIG. 4).

Figure 4:
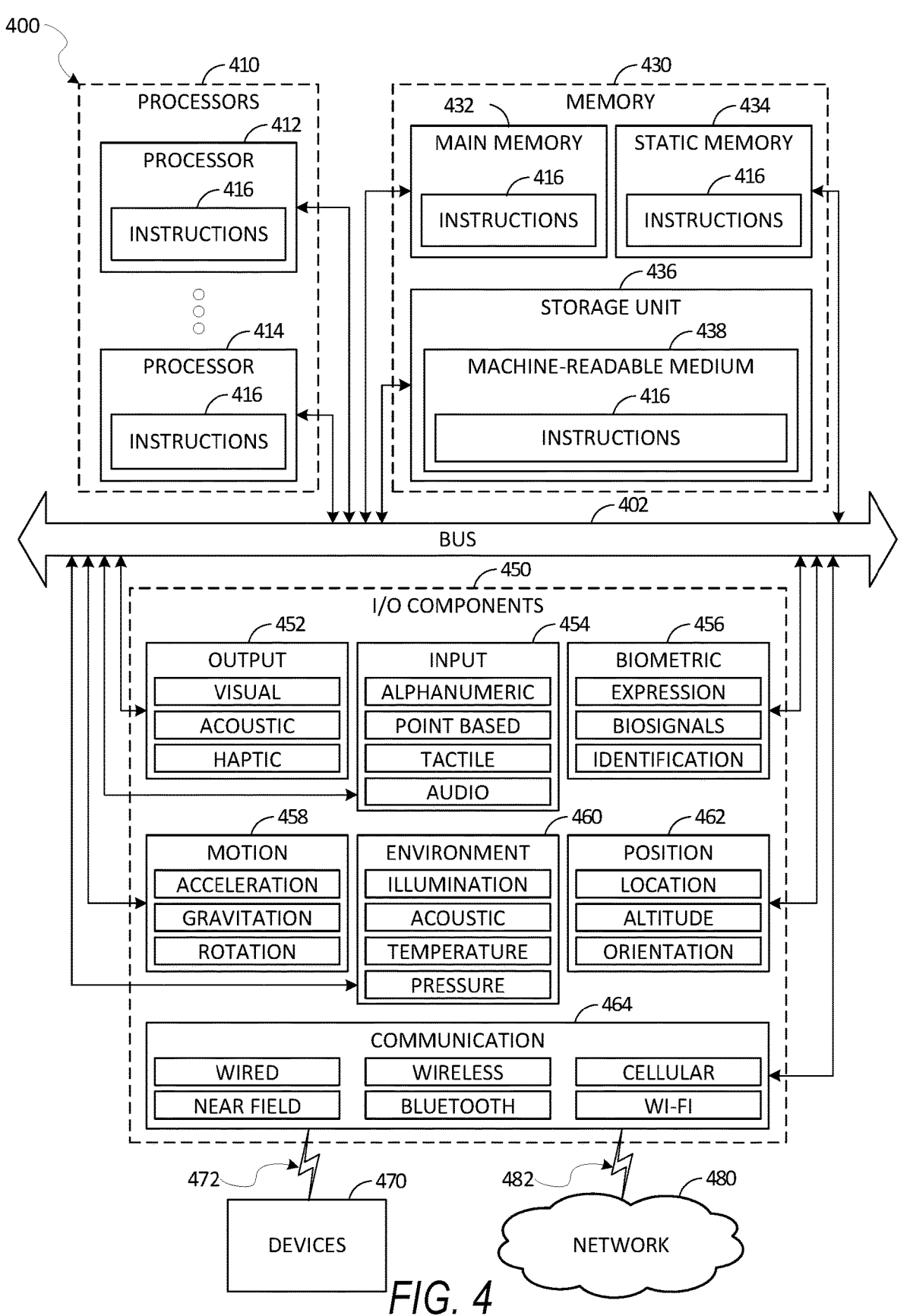
FIG. 4 is a block diagram illustrating components of a machine able to read instructions from a machine storage medium and perform any one or more of the methodologies discussed herein according to various embodiments.

FIG. 4 illustrates a diagrammatic representation of a machine 400 in the form of a computer system within which a set of instructions may be executed for causing the machine 400 to perform any one or more of the methodologies discussed herein, according to an example. Specifically, FIG. 4 shows a diagrammatic representation of the machine 400 in the example form of a computer system, within which instructions 416 (e.g., software, a program, an application, an applet, an app, or other executable code) for causing the machine 400 to perform any one or more of the methodologies discussed herein may be executed. For example, the instructions 416 may cause the machine 400, or one or more machines 400, to execute the method 200 described above with respect to FIG. 2. The instructions 416 transform the general, non-programmed machine 400 into a particular machine 400 programmed to carry out the described and illustrated functions in the manner described. In some embodiments, the machine 400 operates as a standalone device or may be coupled (e.g., networked) to other machines. The machine 400 may comprise, but not be limited to, a server computer, a client computer, a personal computer (PC), a tablet computer, a laptop computer, a netbook, a personal digital assistant (PDA), an entertainment media system, a cellular telephone, a smart phone, a mobile device, a headphone, a headset, or any machine capable of executing the instructions 416, sequentially or otherwise, that specify actions to be taken by the machine 400. Further, while only a single machine 400 is illustrated, the term "machine" shall also be taken to include a collection of machines 400 that individually or jointly execute the instructions 416 to perform any one or more of the methodologies discussed herein.

The machine 400 may include processors 410, memory 430, and I/O components 450, which may be configured to communicate with each other such as via a bus 402. In an example, the processors 410 (e.g., a hardware processor, such as a central processing unit (CPU), a reduced instruction set computing (RISC) processor, a complex instruction set computing (CISC) processor, a graphics processing unit (GPU), a digital signal processor (DSP), an application-specific integrated circuit (ASIC), a radio-frequency integrated circuit (RFIC), another processor, or any suitable combination thereof) may include, for example, a processor 412 and a processor 414 that may execute the instructions 416. The term "processor" is intended to include multi-core processors that may comprise two or more independent processors (sometimes referred to as "cores") that may execute instructions contemporaneously. Although FIG. 4 shows multiple processors 410, the machine 400 may include a single processor with a single core, a single processor with multiple cores (e.g., a multi-core processor), multiple processors with a single core, multiple processors with multiples cores, or any combination thereof.

The memory 430 may include a main memory 432, a static memory 434, and a storage unit 436 including machine-readable medium 438, each accessible to the processors 410 such as via the bus 402. The main memory 432, the static memory 434, and the storage unit 436 store the instructions 416 embodying any one or more of the methodologies or functions described herein. The instructions 416 may also reside, completely or partially, within the main memory 432, within the static memory 434, within the storage unit 436, within at least one of the processors 410 (e.g., within the processor's cache memory), or any suitable combination thereof, during execution thereof by the machine 400.

The I/O components 450 may include a wide variety of components to receive input, provide output, produce output, transmit information, exchange information, capture measurements, and so on. The specific I/O components 450 that are included in a particular machine will depend on the type of machine. For example, portable machines such as mobile phones will likely include a touch input device or other such input mechanisms, while a headless server machine will likely not include such a touch input device. In further examples, the I/O components 450 may include biometric components 456, motion components 458, environmental components 460, or position components 462, among a wide array of other components.

Communication may be implemented using a wide variety of technologies. The I/O components 450 may include communication components 464 operable to couple the machine 400 to a network 480 or devices 470 via a coupling 482 and a coupling 472, respectively. For example, the communication components 464 may include a network interface component or another suitable device to interface with the network 480.

Certain examples are described herein as including logic or a number of components, modules, elements, or mechanisms. Such modules can constitute either software modules (e.g., code embodied on a machine-readable medium or in a transmission signal) or hardware modules. A "hardware module" or "hardware component" is a tangible unit capable of performing certain operations and can be configured or arranged in a certain physical manner. In various embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In various embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an ASIC. A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering examples in which hardware modules are temporarily configured (e.g., programmed), each of the hardware modules need not be configured or instantiated at any one instance in time.

Hardware modules, or hardware components can provide information to, and receive information from, other hardware modules or components. Accordingly, the described hardware modules (or hardware components) can be regarded as being communicatively coupled. Where multiple hardware modules exist contemporaneously, communications can be achieved through signal transmission (e.g., over appropriate circuits and buses) between or among two or more of the hardware modules. In examples in which multiple hardware modules are configured or instantiated at different times, communications between or among such hardware modules may be achieved, for example, through the storage and retrieval of information in memory structures to which the multiple hardware modules have access.

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 400 including processors 410), with these operations being accessible via a network (e.g., the Internet) and via one or more appropriate interfaces (e.g., an API). In certain examples, a client device may relay or operate in communication with cloud computing systems and may access circuit design information in a cloud environment.

The performance of certain of operations may be distributed among the processors, not only residing within a single machine 400, but deployed across a number of machines 400. In some examples, the processors 410 or processor-implemented modules are located in a single geographic location (e.g., within a home environment, an office environment, or a server farm). In other examples, the processors or processor-implemented modules are distributed across a number of geographic locations.

EXAMPLES

The following examples describe various embodiments of methods, machine-readable media, and systems (e.g., machines, devices, or other apparatus) discussed herein.

1. A circuit comprising:
   an audio hardware component configured to output a differential audio signal;
   a radio frequency hardware component configured to output a radio frequency signal;
   an audio power amplifier output matching network communicatively coupled to the audio hardware component and a first capacitor, a positive audio signal output pad, and a first inductor that is communicatively coupled to a negative signal output pad and a second capacitor;

a radio frequency matching network communicatively coupled to the radio frequency hardware component and a third capacitor that is communicatively coupled to the audio power amplifier output matching network, the first capacitor, and the first inductor; and
   a speaker communicatively coupled to a speaker cable that comprises plural wires communicatively coupled to the positive audio signal output pad and the negative signal output pad.

2. The circuit of example 1, wherein the audio power amplifier output matching network comprises a fourth capacitor, a fifth capacitor, a first resistor, a second resistor, a second inductor, and a third inductor, the fourth capacitor communicatively coupled to the first resistor and the second inductor, the fifth capacitor communicatively coupled to the second resistor and the third inductor.

3. The circuit of any of the preceding examples, wherein the first resistor and the second resistor are communicatively coupled to ground.

4. The circuit of any of the preceding examples, wherein a frequency range of the radio frequency signal is between 2.4 GHz and 2.5 GHZ, and wherein the audio power amplifier output matching network comprises a hardware component that matches impedance of the audio hardware component to impedance of the speaker, and wherein the radio frequency matching network comprises a hardware component that matches impedance of the radio frequency hardware component to the impedance of the speaker.

5. The circuit of any of the preceding examples, wherein the positive audio signal output pad is communicatively coupled to a positive wire included in the speaker cable, and wherein the negative signal output pad is communicatively coupled to a negative wire included in the speaker cable.

6. The circuit of any of the preceding examples, wherein the speaker cable functions as an antenna for radio frequency signal transmission during operation.

7. The circuit of any of the preceding examples, wherein energy of the radio frequency signal passes through the first capacitor with little or no energy passing through the first inductor, causing the speaker cable to operate as an antenna for radio frequency signal transmission.

8. The circuit of any of the preceding examples, wherein the antenna for radio frequency signal transmission is a Planar Inverted F-Antenna (PIFA).

9. The circuit of claim 1, wherein the first inductor is communicatively coupled to the negative signal output pad and directly to ground without including the second capacitor.

10. The circuit of any of the preceding examples, wherein the speaker cable functions as a monopole antenna for radio frequency signal transmission during operation.

11. A method comprising:
   generating, via an audio hardware component included in a circuit, a differential audio signal;
   generating, via a radio frequency hardware component included in the circuit, a radio frequency signal; and
   outputting the differential audio signal and the radio frequency signal via a speaker cable communicatively coupled to the circuit, the speaker cable being configured to operate as a Planar Inverted F-Antenna (PIFA).

12. The method of example 11, wherein the circuit comprises an audio power amplifier output matching network, a radio frequency matching network, the audio power amplifier output matching network being communicatively coupled to the audio hardware component and a first capacitor, a positive audio signal output pad, and a first inductor that is communicatively coupled to a negative signal output pad and a second capacitor, the radio frequency matching network being communicatively coupled to the radio frequency hardware component and a third capacitor that is communicatively coupled to the audio power amplifier output matching network, the first capacitor, and the first inductor.

13. The method of any of the preceding examples, wherein the audio power amplifier output matching network comprises a fourth capacitor, a fifth capacitor, a first resistor, a second resistor, a second inductor and a third inductor, the fourth capacitor communicatively coupled to the first resistor and the second inductor, the fifth capacitor communicatively coupled to the second resistor and the third inductor.

14. The method of any of the preceding examples, wherein the first resistor and the second resistor are communicatively coupled to ground.

15. The method of any of the preceding examples, wherein the positive audio signal output pad is communicatively coupled to a positive wire included in the speaker cable, and wherein the negative signal output pad is communicatively coupled to a negative wire included in the speaker cable.

16. The method of any of the preceding examples, wherein energy of the radio frequency signal passes through the first capacitor with little or no energy passing through the first inductor, causing the speaker cable to operate as an antenna for radio frequency signal transmission.

17. The method of any of the preceding examples, wherein the first inductor is communicatively coupled to the negative signal output pad and directly to ground without the second capacitor.

18. The method of any of the preceding examples, wherein the speaker cable functions as a monopole antenna for radio frequency signal transmission during operation.

19. The method of any of the preceding examples, wherein a frequency range of the radio frequency signal is between 2.4 GHz and 2.5 GHz.

20. A system comprising:
    an audio hardware component configured to output a differential audio signal;
    a radio frequency hardware component configured to output a radio frequency signal;
    an audio power amplifier output matching network communicatively coupled to the audio hardware component and a first capacitor, a positive audio signal output pad, and a first inductor that is communicatively coupled to a negative signal output pad and a second capacitor;
    a radio frequency matching network communicatively coupled to the radio frequency hardware component and a third capacitor that is communicatively coupled to the audio power amplifier output matching network, the first capacitor, and the first inductor; and
    a speaker communicatively coupled to a speaker cable that comprises plural wires communicatively coupled to the positive audio signal output pad and the negative signal output pad, the speaker cable is configured to operate as a Planar Inverted F-Antenna (PIFA) or a monopole antenna for radio frequency signal transmission.

Throughout this specification, plural instances may implement resources, components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components.

As used herein, the term "or" may be construed in either an inclusive or exclusive sense. The terms "a" or "an" should be read as meaning "at least one," "one or more," or the like. The presence of broadening words and phrases such as "one or more," "at least," "but not limited to," or other like phrases in some instances shall not be read to mean that the narrower case is intended or required in instances where such broadening phrases may be absent. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments. The specification and drawings are, accordingly, to be regarded in an illustrative rather than a restrictive sense.

It will be understood that changes and modifications may be made to the disclosed examples without departing from the scope of the present disclosure. These and other changes or modifications are intended to be included within the scope of the present disclosure.

What is claimed is:

1. A circuit comprising: an audio hardware component configured to output a differential audio signal; a radio frequency hardware component configured to output a radio frequency signal; an audio power amplifier output matching network communicatively coupled to the audio hardware component and a first capacitor, a positive audio signal output pad, and a first inductor that is communicatively coupled to a negative signal output pad and a second capacitor; a radio frequency matching network communicatively coupled to the radio frequency hardware component and a third capacitor that is communicatively coupled to the audio power amplifier output matching network, the first capacitor, and the first inductor; and a speaker communicatively coupled to a speaker cable configured to operate as an antenna for radio frequency signal transmission, that comprises plural wires communicatively coupled to the positive audio signal output pad and the negative signal output pad.

2. The circuit of claim 1, wherein the audio power amplifier output matching network comprises a fourth capacitor, a fifth capacitor, a first resistor, a second resistor, a second inductor, and a third inductor, the fourth capacitor communicatively coupled to the first resistor and the second inductor, the fifth capacitor communicatively coupled to the second resistor and the third inductor.

3. The circuit of claim 2, wherein the first resistor and the second resistor are communicatively coupled to ground.

4. The circuit of claim 1, wherein a frequency range of the radio frequency signal is between 2.4 GHz and 2.5 GHz, and wherein the audio power amplifier output matching network comprises a hardware component that matches impedance of the audio hardware component to impedance of the speaker, and wherein the radio frequency matching network comprises a hardware component that matches impedance of the radio frequency hardware component to the impedance of the speaker.

5. The circuit of claim 1, wherein the positive audio signal output pad is communicatively coupled to a positive wire included in the speaker cable, and wherein the negative signal output pad is communicatively coupled to a negative wire included in the speaker cable.

6. The circuit of claim 5, wherein the speaker cable functions as an antenna for radio frequency signal transmission during operation.

7. The circuit of claim 5, wherein energy of the radio frequency signal passes through the first capacitor with little or no energy passing through the first inductor, causing the speaker cable to operate as an antenna for radio frequency signal transmission.

8. The circuit of claim 6, wherein the antenna for radio frequency signal transmission is a Planar Inverted F-Antenna (PIFA).

9. The circuit of claim 1, wherein the first inductor is communicatively coupled to the negative signal output pad and directly to ground without including the second capacitor.

10. The circuit of claim 9, wherein the speaker cable functions as a monopole antenna for radio frequency signal transmission during operation.

11. A method comprising:

generating, via an audio hardware component included in a circuit, a differential audio signal;

generating, via a radio frequency hardware component included in the circuit, a radio frequency signal; and outputting the differential audio signal and the radio frequency signal via a speaker cable communicatively coupled to the circuit, the speaker cable being configured to operate as a Planar Inverted F-Antenna (PIFA).

12. The method of claim 11, wherein the circuit comprises an audio power amplifier output matching network, a radio frequency matching network, the audio power amplifier output matching network being communicatively coupled to the audio hardware component and a first capacitor, a positive audio signal output pad, and a first inductor that is communicatively coupled to a negative signal output pad and a second capacitor, the radio frequency matching network being communicatively coupled to the radio frequency hardware component and a third capacitor that is communicatively coupled to the audio power amplifier output matching network, the first capacitor, and the first inductor.

13. The method of claim 12, wherein the audio power amplifier output matching network comprises a fourth capacitor, a fifth capacitor, a first resistor, a second resistor, a second inductor and a third inductor, the fourth capacitor communicatively coupled to the first resistor and the second inductor, the fifth capacitor communicatively coupled to the second resistor and the third inductor.

14. The method of claim 13, wherein the first resistor and the second resistor are communicatively coupled to ground.

15. The method of claim 12, wherein the positive audio signal output pad is communicatively coupled to a positive wire included in the speaker cable, and wherein the negative signal output pad is communicatively coupled to a negative wire included in the speaker cable.

16. The method of claim 12, wherein energy of the radio frequency signal passes through the first capacitor with little or no energy passing through the first inductor, causing the speaker cable to operate as an antenna for radio frequency signal transmission.

17. The method of claim 12, wherein the first inductor is communicatively coupled to the negative signal output pad and directly to ground without the second capacitor.

18. The method of claim 17, wherein the speaker cable functions as a monopole antenna for radio frequency signal transmission during operation.

19. The method of claim 11, wherein a frequency range of the radio frequency signal is between 2.4 GHz and 2.5 GHz.

20. A system comprising:

an audio hardware component configured to output a differential audio signal;

a radio frequency hardware component configured to output a radio frequency signal;

an audio power amplifier output matching network communicatively coupled to the audio hardware component and a first capacitor, a positive audio signal output pad, and a first inductor that is communicatively coupled to a negative signal output pad and a second capacitor;

a radio frequency matching network communicatively coupled to the radio frequency hardware component and a third capacitor that is communicatively coupled to the audio power amplifier output matching network, the first capacitor, and the first inductor; and a speaker communicatively coupled to a speaker cable that comprises plural wires communicatively coupled to the positive audio signal output pad and the negative signal output pad, the speaker cable is configured to operate as a Planar Inverted F-Antenna (PIFA) or a monopole antenna for radio frequency signal transmission.

* * * * *